(12) United States Patent
Moran (10) Patent No.: US 7,439,480 B2
(45) Date of Patent: Oct. 21, 2008

(54) REGULATED CURRENT MIRROR

(75) Inventor: Timothy G. Moran, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 42 days.

(21) Appl. No.: 11/072,180

(22) Filed: Mar. 4, 2005

(65) Prior Publication Data

US 2005/0194955 A1 Sep. 8, 2005

Related U.S. Application Data (60) Provisional application No. 60/550,581, filed on Mar. 5, 2004.

(51) Int. Cl.
*H03F 3/08* (2006.01)
*G01J 1/44* (2006.01)
(52) U.S. Cl. .............................. 250/214 A; 250/214 R
(58) Field of Classification Search ............. 250/208.1, 250/214, 214 R, 200, 214 A, 205, 214 LA, 250/214 C; 348/302, 308, 310, 180; 327/53, 327/54, 51, 52; 315/150, 153
See application file for complete search history.

(56) References Cited

U.S. PATENT DOCUMENTS

| 4,446,443 A * | 5/1984 | Johnson et al. ............. 330/257 |
|---|---|---|
| 6,392,215 B1 * | 5/2002 | Baumgartner et al. ........ 250/205 |
| 6,635,857 B1 * | 10/2003 | Kindt ....................... 250/208.1 |
| 6,885,958 B2 * | 4/2005 | Yaklin ........................ 702/107 |
| 2003/0098407 A1 * | 5/2003 | Ames et al. ............... 250/214.1 |
| 2003/0107439 A1 * | 6/2003 | Callahan, Jr. ................ 330/257 |

OTHER PUBLICATIONS

U.S. Appl. No. 11/072,179, filed Mar. 4, 2005 entitled "Continuous Temperature Compensation for a Laser Modulation Current."

* cited by examiner

*Primary Examiner*—Georgia Y. Epps
*Assistant Examiner*—Don Williams
(74) *Attorney, Agent, or Firm*—Workman Nydegger (57) ABSTRACT

Systems and methods for regulating a current mirror. A current mirror includes mirror circuits that each include a transistor or a transistor network. A mirror circuit in the current mirror is used by a detector of an optical receiver to draw current in response to an incident optical signal on the photodiode. The transistor in the current mirror is connected with a regulating amplifier that drives a gate of the transistor. The regulating amplifier uses the drain voltage of the transistor as an input such that the amplifier's output drives the gate such that the drain voltage substantially matches a reference voltage that is also an input to the regulating amplifier. The regulating amplifier can be integrated with the current mirror and eliminates the need for an external capacitor to reduce the effects of noise on current drawn by the detector.

35 Claims, 4 Drawing Sheets

REGULATED CURRENT MIRROR

CROSS-REFERENCE TO RELATED APPLICATIONS

This application claims the benefit of U.S. Provisional Application No. 60/550,581, filed Mar. 5, 2004, which is hereby incorporated by reference.

BACKGROUND OF THE INVENTION

1. The Field of the Invention

The present invention relates to systems and methods for regulating a reference current in a current mirror. More particularly, the present invention relates to systems and methods for reducing or eliminating the effect of noise on a reference current drawn by a load such as a photodiode, thereby eliminating the need for an external capacitor.

2. The Relevant Technology

In optical networks, light is transmitted over optical fibers from node to node. Each node usually includes some sort of transceiver, which includes an optical transmitter for transmitting optical signals and an optical receiver for receiving optical signals. The optical transmitter launches an optical signal into the optical fibers of an optical network and the optical signal is ultimately received by an optical receiver that has the ability to identify and process the data in the optical signal.

Detecting an optical signal usually begins when an optical signal exits an optical fiber and impinges a detector in the optical receiver. The detector in many optical receivers is a photodiode such as a PIN photodiode or an avalanche photodiode. A photodiode is a device that converts optical energy to electrical energy by producing a current in response to the optical signal. The current produced by the photodiode is related to the energy level of the optical signal detected by the photodiode.

The photodiode is typically reverse biased and is connected to a current mirror. The photodiode draws a current from the current mirror in response to the power or intensity of the optical signal. The current mirror also measures the current in the photodiode by mirroring the current drawn by the photodiode.

Changes in the current produced by the detector correspond to data in the optical signal and the ability of the optical receiver to successfully interpret the optical signal is often related to the noise. Noise is often defined as electrical or optical energy that is not part of the electrical or optical signal. Noise is present in most optical receivers and the ability of an optical receiver to successfully receive and interpret an optical signal depends on its ability to reject or handle the noise that is present. Noise can seriously impact the operation of the receiver.

For example, a photodiode is typically connected to a power supply through the current mirror. Noise on the power supply can affect the current flowing through the photodiode and adversely affect the ability of the receiver to read the incoming optical signal correctly. In other words, noise in the power supply often passes through the current mirror to the photodiode that receives the optical signal.

One of the ways that noise or the effects of the noise on the power supply are reduced is to connect the photodiode with a filter network that includes a capacitance. At high frequencies, the capacitance has low impedance and can reduce the effects of the noise on the current generated by the photodiode. The current mirror may also have a similar capacitance that is configured to help prevent high frequency noise from reaching the photodiode. In effect, the capacitor decouples the noise.

While capacitors can be formed in integrated circuits, capacitors can consume a significant amount of space. This is one of the reasons that capacitors used to filter or decouple noise on the supply are connected as external capacitors. Even though external capacitors may be less expensive than capacitors integrated into the integrated circuits, external capacitors are components that still involve cost and consume board space.

BRIEF SUMMARY OF THE INVENTION

These and other limitations are overcome by embodiments of the present invention, which relate to systems and methods for regulating a current mirror. Embodiments further relate to systems and methods for reducing the effects of noise on current drawn by a detector in an optical receiver. In one embodiment, a detector such as the photodiode of an optical receiver draws a reference current from a current mirror. The reference current is drawn through, for example, a PMOS transistor or other transistor based current mirror that is connected to a power supply. In the PMOS configuration, source connects with the power supply and the drain of the transistor is typically connected with the detector.

In most systems, the power supply experiences noise that can impact the current being drawn by the detector. In one embodiment, an amplifier is connected with the gate of the transistor. A negative feedback loop alters the voltage (or current) at the gate of the transistor in response to the noise at the power supply such that the voltage at the drain is held constant even though the power supply experiences voltage fluctuations or noise. For example, when the drain voltage begins to change, the amplifier drives the gate via the feedback loop such that the drain voltage does not change. This eliminates the need for an external capacitor and the need to integrate a relatively large capacitor into the integrated circuit.

The reference current drawn by the detector is mirrored in the current mirror. One of the mirrored currents can be used to monitor or measure the reference current. In another embodiment, a switching network is connected to the mirrored current. The switching network has inputs that can be set to select or change the resistance used to measure the mirrored current. This enables the reference current to be monitored or measured more accurately and over a wider range of detector gains, for example.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The present invention relates to systems and methods for detecting an optical signal and more particularly to systems and methods for reducing noise and/or the effects of noise in an optical receiver to facilitate the successful detection of an optical signal. Embodiments of the present invention reduce or eliminate the need externally coupled capacitors as well as integrated capacitors.

In one embodiment, a current mirror is provided that mirrors a reference current that represents current in, for example, a detector of an optical receiver such as a photodiode. The reference current is regulated such that the bias voltage of the detector (which bias voltage appears at a node connecting the current mirror with the detector in one example) is held constant. In other words, the voltage at a cathode of the photodiode does not change in response to noise on the power supply. By holding the bias voltage of the photodiode constant, the variations in current produced by the photodiode correspond to the intensity of the incident optical signal and effects in the reference current from noise are reduced or eliminated.

Figure 1:
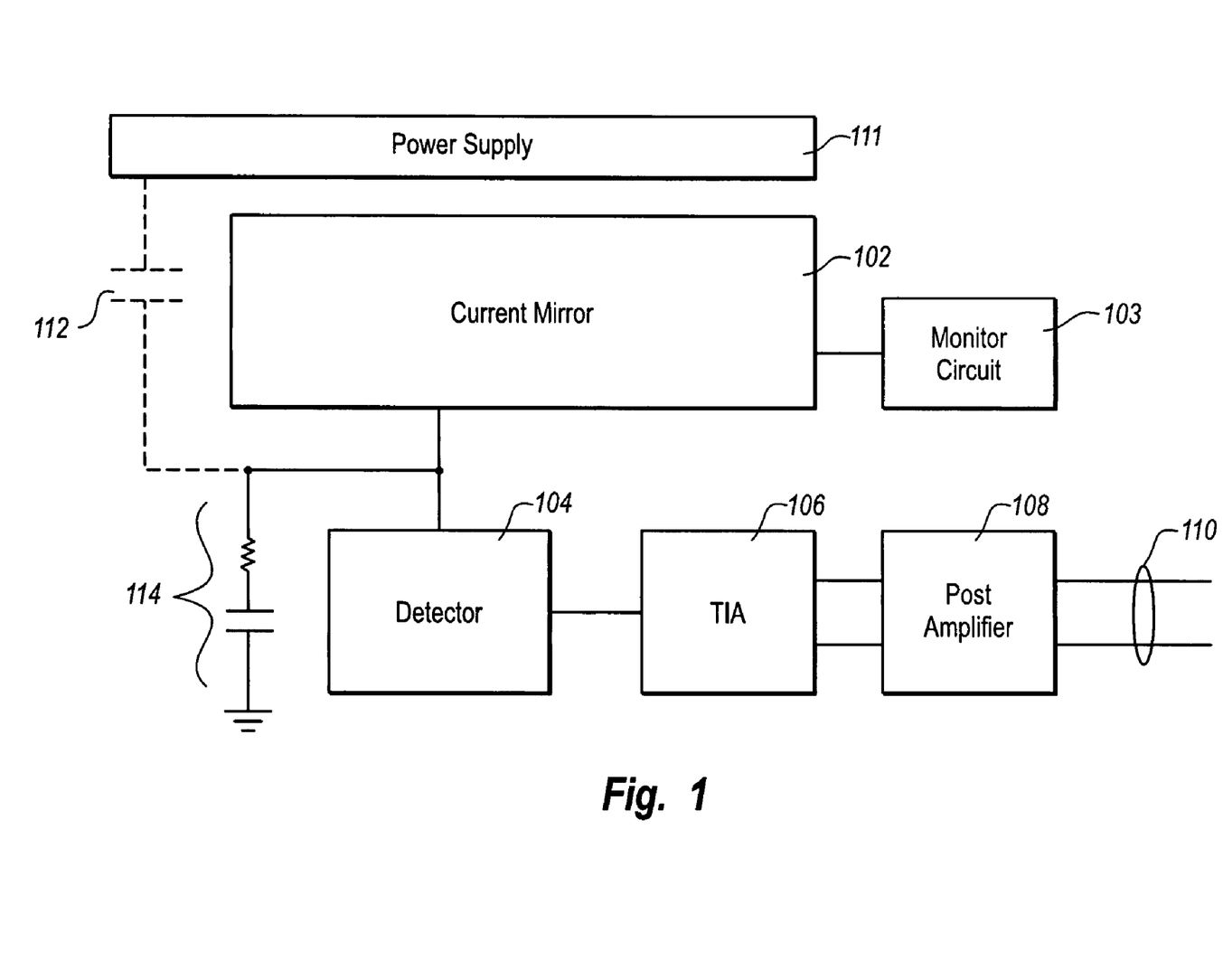
FIG. 1 illustrates an exemplary environment for implementing embodiments of the present invention and illustrates the ability to eliminate external capacitors used to reduce the effects of noise.

FIG. 1 illustrates an exemplary environment for implementing embodiments of the present invention. In FIG. 1, a detector 104 receives an optical signal from a source, such as an optical fiber. The current mirror 102 is connected with the detector 104 in a manner that permits the detector 104 to draw variable amounts of current in response to changes in the optical power of the incident optical signal. The current mirror 102 typically has another output that is provided to the monitor circuit 103. The current provided to the monitor circuit 103 is a scaled mirror current of the reference current through the detector 104. The monitor circuit 103 can be used to measure the reference current passing through the detector 104.

The current generated by the detector 104 is input to a transimpedance amplifier (TIA) 106 that amplifies the current to produce a differential voltage signal in this example. The differential voltage signal is further processed and amplified by the post amplifier 108 and output as an electrical data stream 110.

As previously indicated, it is desirable to prevent or limit noise from affecting the current produced by the detector 104. The current produced by the detector 104 in response to the optical signal can be reduced or increased by noise such as power supply noise, ground supply noise, and the like. When noise reaches the detector 104, the optical signal may not be interpreted correctly because the current input to the TIA 106 may be at least partially attributable to the noise. Noise, for example, can make a "0" look like a "1", a "1" look like a "0", or make a bit unreadable.

For at least this reason, it is desirable to limit the noise at the detector 104 (and other parts of an optical receiver/transmitter). As previously described, the capacitor 112 (shown in dotted lines), which is external to the current mirror 102, was previously used to prevent or reduce the impact of the noise or changes in the power supply 111 on the current produced by the detector 104. Producing the capacitor as an integrated circuit is expensive as the capacitor 112 requires significant die space. While implementing the capacitor 112 as an external capacitor is usually less expensive, the capacitor 112 still introduces cost and consumes board space.

Noise at the detector 104 is also reduced by a filter 114, which is usually associated with the detector 104. The filter 114 may be configured to prevent noise from influencing the current produced by the detector 104.

Figure 2:
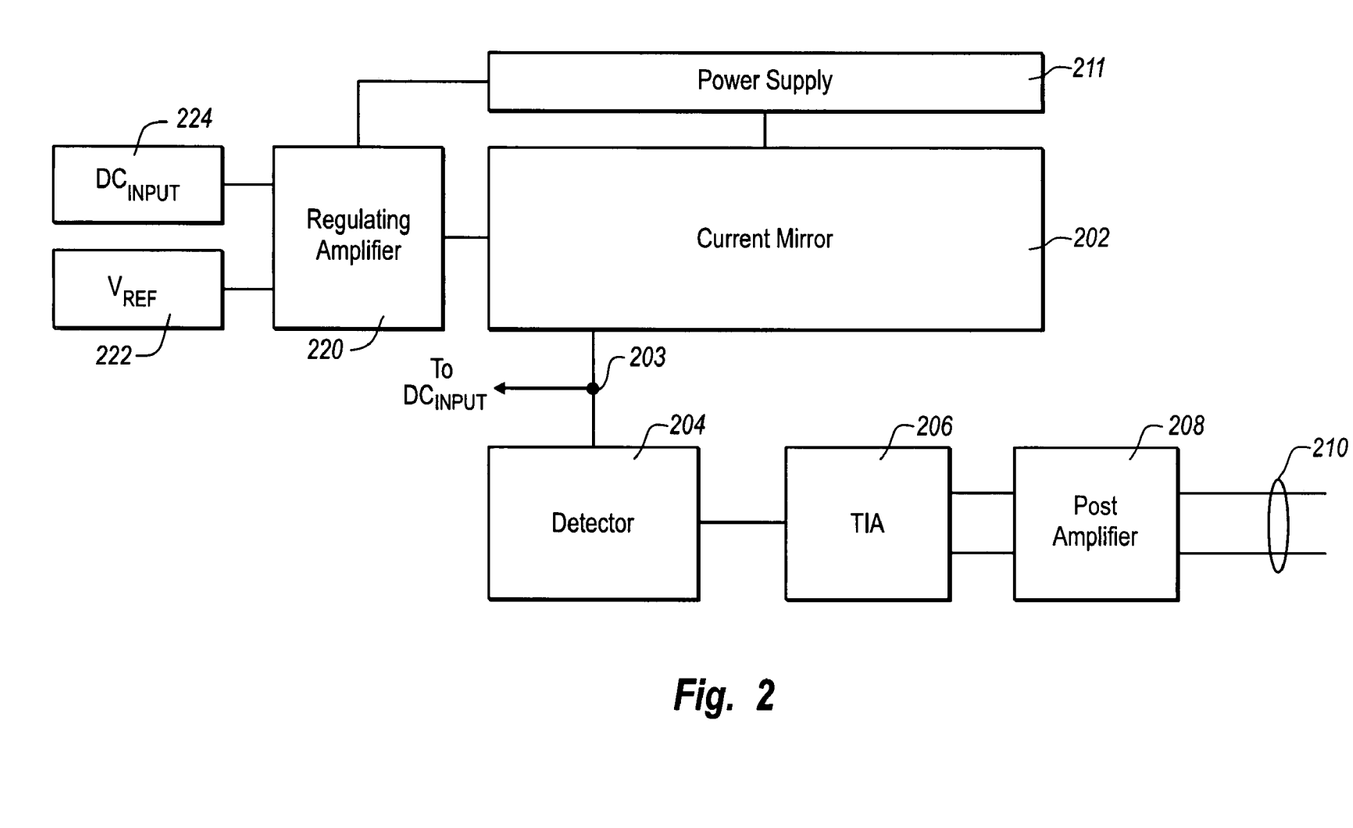
FIG. 2 illustrates one embodiment of a current mirror that is controlled with a regulating amplifier to provide a substantially constant voltage for a load such that the effect of noise from the power supply on the load is reduced.

FIG. 2 illustrates one embodiment of the invention that uses an amplifier connected with the current mirror to correct errors that may be the result of, for example, noise on the power supply. The amplifier can be integrated with the current mirror and requires less die space than a capacitor. In this embodiment, the current mirror 202 is connected with a regulating amplifier 220. The inputs to the regulating amplifier are a reference voltage ($V_{REF}$) 222 and a $DC_{INPUT}$ 224. The $DC_{INPUT}$ 224 is typically connected with the node 203.

One purpose of the regulating amplifier 220 is to keep the voltage at the node 203 constant. The $V_{REF}$ 222 is constant and as the $DC_{INPUT}$ 224 changes (in response to noise on the power supply, for example), the regulating amplifier 220 generates a current or voltage such that the voltage at the node 203 remains unchanged. When the voltage from the power supply 211 experiences ripples or noise, the regulating amplifier 220 ensures that the voltage at the node 203 does not change or reduces the voltage change that would otherwise occur with the noise or voltage. This has the advantage of preventing power supply noise from affecting the current produced by the detector 204. In addition, the external capacitor 112 illustrated in FIG. 1 can be eliminated, thereby reducing cost and saving board space. The regulating amplifier 220 can be integrated with the current mirror 202 on the same integrated circuit in one embodiment.

Figure 3:
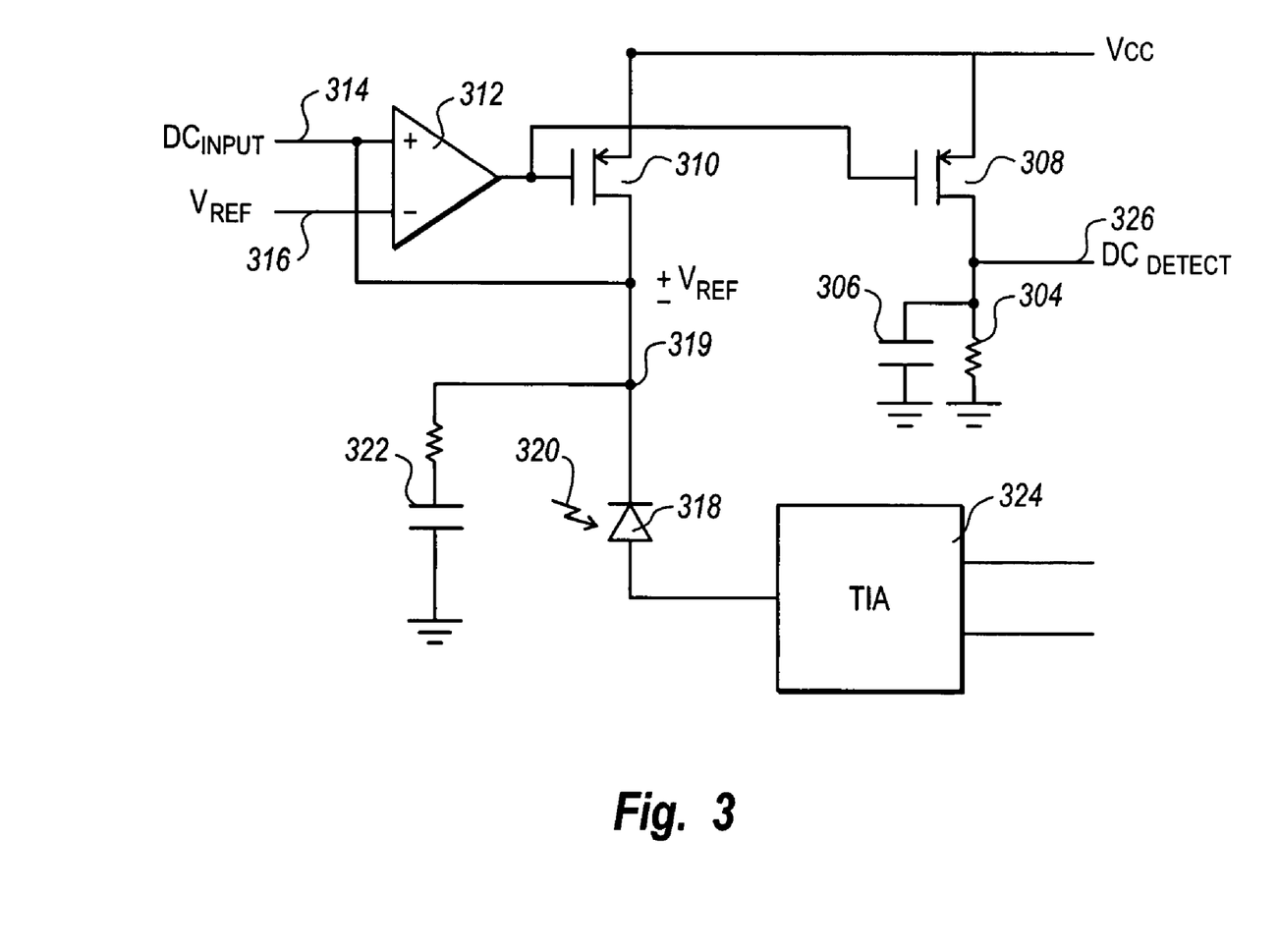
FIG. 3 is a schematic of one embodiment of an amplifier regulated current mirror.

FIG. 3 illustrates a schematic of one embodiment of the present invention. In FIG. 3, an optical signal 320 is incident on a photodiode 318. The photodiode 318 produces a current that is related to the optical power or intensity of the optical signal 320. The photodiode 318 is also connected with a transistor 310. In this example, the transistor 310 is a p-channel enhancement-type MOSFET, although one of skill in the art can appreciate the use of other types of transistors. The source of the transistor 310 is connected with a power supply ($V_{CC}$) and the drain is connected with the photodiode 318.

The gate of the transistor 310 is electrically connected with the output of the amplifier 312. In this example, the inputs to the amplifier 312 are the $V_{REF}$ 316 and a $DC_{INPUT}$ 314. The $DC_{INPUT}$ 314 is connected with the node 319, which connects the photodiode 318 with the drain of the transistor 310.

As the photodiode 318 detects the optical signal 320, the current flowing in the photodiode 318 changes in response to the bits in the optical signal 320. To insure that the current produced by the photodiode 318 is related to the optical signal, the node 319 should be kept at a constant voltage. By feeding the voltage at the node 319 back into the amplifier 312, the amplifier 312 can regulate or control the gate of the transistor 310.

For example, when the voltage $V_{CC}$ experiences noise including high frequency noise, it is likely that this noise or change in voltage will appear at the node 319. When a change in voltage at the node 319 is input to the amplifier 312, the voltage or current at the gate of the transistor 310 is altered. In one embodiment, the amplifier 312 is configured to drive the gate voltage substantially the same amount as the change experienced at the node 319 or of the supply $V_{CC}$. By driving the gate of the transistor 310, the voltage 319 is kept substantially equal to $V_{REF}$ 316. A constant voltage or a substantially constant voltage at the node 319 reduces the effect of the noise of the power supply $V_{CC}$ on the current produced by the photodiode 318. In other words, the amplifier 312 is connected with the current mirror such that the voltage at the node 319 is substantially equal to the $V_{REF}$ voltage.

The current flowing through the transistor 310 and the photodiode 318 is a reference current and the transistor 308 is configured to mirror the reference current through the transistor 310. In one embodiment, the reference current in the transistor 308 is scaled by using, for example, an appropriately formed transistor 308. By measuring the voltage at the node 326 and using a known impedance represented by the capacitor 306 and the resistor 304, the reference current in the transistor 310 can be measured or monitored. In this example, the amplifier 312 also drives the gate of the transistor 308 in addition to the gate of the transistor 310.

The amplifier 312 may also have a negative feedback loop that can be an integral part of the amplifier 312. The negative feedback loop band limits the amplifier 312 and prevents the amplifier 312, in one embodiment, from oscillating. The negative feedback loop provides stability to the amplifier 312.

Figure 4:
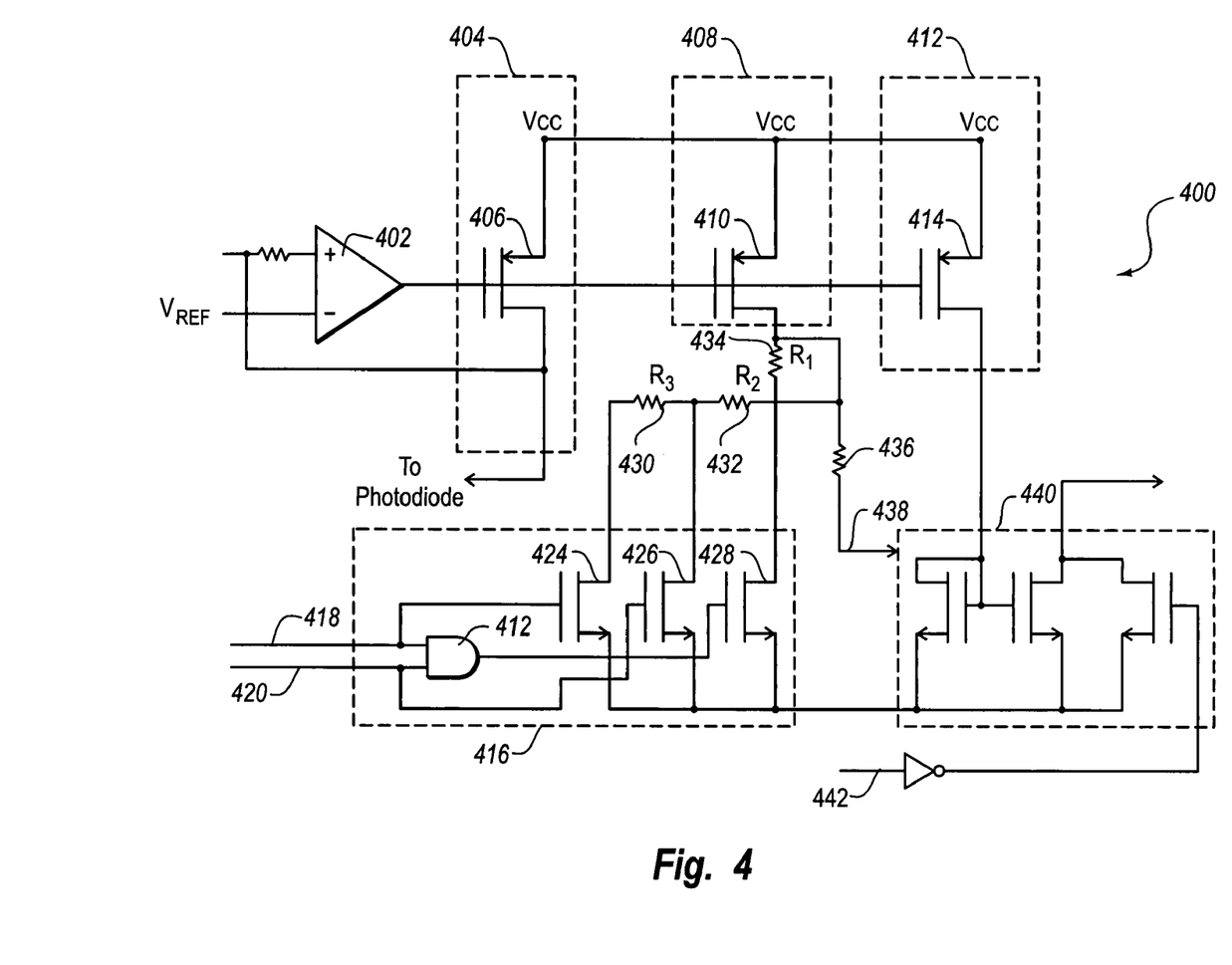
FIG. 4 is a schematic of an embodiment of an amplifier regulated current mirror that includes a switching network for selecting an impedance or resistance to monitor the current.

FIG. 4 illustrates another embodiment of a regulated current mirror 400. Although FIG. 4 illustrates that the current mirror can be configured to generate multiple currents, each of which is a mirror of the reference current drawn, in this example, by the detector of an optical receiver. Each current is generated by a mirror circuit in the current mirror. For example, the mirror circuit 404 produces the reference current drawn by the photodiode, the mirror circuit 408 is a mirrored version of the reference current and the mirror circuit 412 generates another mirrored current that is related to the reference current.

In FIG. 4, the transistor 406 is regulated by the amplifier 402 as previously described with reference to FIG. 3. In this example, the current in the transistor 406 is the reference current drawn by a load such as a photodiode. Regulating the voltage or current at the gate based on the voltage at the drain of the transistor 406 stabilizes the voltage at the drain and thereby provides a constant voltage to the photodiode.

The amplifier 402 also drives the gate of the transistor 410 in the current mirror 408, which produces a scaled version of the reference current in the main current mirror 404. As previously described, the current mirror 408 includes a transistor 410 that produces an output 438 that can be used to measure or monitor the reference current generated by the photodiode.

This embodiment of the current mirror 400, however, also includes a switching network 416 that can change the resistance used to measure or monitor the current in the transistor 406. More particularly, the transistors 424, 426, and 428 are controlled by the input signals 418 and 420. The input signals 418 and 420 can be set either manually or automatically. Using the AND gate 422, the transistors 424, 426, and 428 can be controlled in a manner that sets an impedance or resistance of the switching network 416.

The input signals 418 and 420 can be used to turn the transistors 424, 426, and 428 on or off in various configurations. Depending on the state of the input signals 418 and 420, various combinations of the resistors 434, 432, and 430 are connected in series to provide a resistance from which the mirrored current is measured. For example, the resistor 434 is used when the transistor 428 is on and the transistors 424 and 426 are off. The resistances 434 and 432 are used to measure the current when the transistor 426 is on and the transistors 424 and 428 are off. The resistances 434, 432, and 430 are used to measure or monitor the current when the transistor 424 is on and the transistors 426 and 428 are off.

One of the advantages of controlling the resistance of the switching network 416 is that the current mirror 400 is better suited to be used with different types of loads. For example, some photodiodes are more appropriate for short wave applications while other photodiodes are more suitable for long wave applications. The gain of photodiodes in short wave applications is often different than the gain of photodiodes selected for long wave applications. More specifically, the distance that the optical travels, the wavelength, the gain of the photodiode, and/or type of laser generating the optical signal, and the like may be considered when setting the resistance of the switching network 416.

In one embodiment, the switching network 416 provides the ability to select a resistance that is suitable for the gain of the photodiode. For example, the switching network 416 is configured to select a large resistance (resistances 434, 432, and 430 may be connected in series) when the photodiode has more gain. In one example, the resistor 434 is 1300 ohms, the resistor 432 is 1300 ohms, and the resistor 430 is 2600 ohms. One of skill in the art can appreciate that other values may be selected.

The current mirror 412 and the transistor network 440 can be used to generate another signal that can be used for monitoring current.

Although FIG. 4 illustrates the current mirrors 404, 408, and 412 as including one transistor, one of skill in the art can appreciate that other transistor configurations can be utilized. Each portion of the current mirrors is a mirror circuit. Further, the current mirror can be connected in a cascode configuration, a Wilson configuration, a modified Wilson configuration, and the like or any combination thereof. In each case, the amplifier 402 can be connected with the gate of a transistor to control the bias voltage of the photodiode or other load.

The principles of the present invention are suitable for 1 G, 2 G, 4 G, 10 G and higher bandwidth fiber channels. Furthermore, the principles of the present invention may be implemented in laser transmitter/receivers of any form factor such as XFP, SFP and SFF, without restriction. Having said this, the principles of the present invention are not limited to a laser transceiver environment at all.

In one embodiment, a current mirror that substantially reduces noise at a node of the current mirror is described and includes a first mirror circuit that that includes a transistor. This mirror circuit delivers a first current to a load through a node that connects the first mirror circuit with the load. An amplifier is also connected with a gate of the transistor in the first mirror circuit. Inputs to the amplifier include a reference voltage and a feedback loop from the node at the load. The feedback loop causes the amplifier to adjust the gate voltage such that the voltage at the node is substantially unchanged in response to noise, for example, at the supply. The current mirror also includes at least one other mirror circuit that mirrors the current generated in the first mirror circuit.

In another embodiment in a system that receives optical signals with a detector, embodiments of the invention relate to a current mirror for use in providing current to the detector such that a reference voltage of the detector is substantially unaffected by noise on a power supply. The current mirror includes a regulating amplifier having as inputs a reference voltage and a node voltage of a node. The output of the regulating amplifier is connected with a current mirror circuit and it drives the current mirror circuit such that the node voltage is substantially matched to the reference voltage when the supply experiences noise. A negative feedback loop may band limit the regulating amplifier. In other words, the node voltage is substantially unaffected by power supply noise.

In one exemplary method, the effects of noise in a power supply can be reduced or eliminated without an external capacitance by, for example, providing a first current to a photodiode of an optical transceiver through a first mirror circuit that includes a transistor. Next, regulate a voltage of a gate of the transistor with an amplifier such that the amplifier keeps a voltage at the drain of the transistor substantially constant in the presence of noise. The inputs to the amplifier are a reference voltage and the existing voltage at the drain of the transistor.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A current mirror that substantially reduces noise at a node of the current mirror, the current mirror comprising:
    a first mirror circuit that includes a transistor, wherein the first mirror circuit delivers a first current to a load through a node that connects the first mirror circuit with the load;
    an amplifier having an output connected with a gate terminal of the transistor of the first current mirror, the amplifier having a first input connected to a reference voltage and a second input connected to a drain terminal of the transistor of the first current mirror, wherein a source terminal of the transistor of the first current mirror is configured to be connected to a power source; and
    a feedback loop that connects the node to the second input of the amplifier, wherein the feedback loop causes the amplifier to adjust a voltage of the gate terminal such that a voltage at the node is substantially unchanged in response to noise.

2. A current mirror as defined in claim 1, further comprising a second mirror circuit that produces a second current that is a scaled version of the first current.

3. A current mirror as defined in claim 2, wherein the second mirror circuit includes a transistor having a gate that is connected to the output of the amplifier.

4. A current mirror as defined in claim 3, wherein an output of the second mirror circuit is connected with a switching network, the switching network having one or more inputs that determine a resistance of the switching network.

5. A current mirror as defined in claim 4, the switching network further comprising a plurality of transistors connected with the one or more inputs such that only one of the plurality of transistors is on at a time.

6. A current mirror as defined in claim 5, the switching network further comprising a plurality of resistors in series, the plurality of resistors connected with the plurality of transistors such that the second current is measured using one or more of the plurality of resistors according to the one or more inputs.

7. A current mirror as defined in claim 1, wherein a drain of the transistor is connected to a photodiode at the node.

8. A current mirror as defined in claim 1, wherein noise at the node causes the amplifier to drive the gate of the transistor such that the voltage at the node substantially matches the reference voltage.

9. A current mirror as defined in claim 1, the first mirror circuit further comprising a diode connected transistor connected to the transistor.

10. A current mirror as defined in claim 1, wherein the transistor in the first mirror circuit is cascoded with at least one other transistor.

11. A current mirror as defined in claim 1, wherein the transistor is a p-type enhancement-type MOSFET.

12. A current mirror as defined in claim 1, wherein the first input is an inverting input terminal and the second input is a noninverting input terminal.

13. In a system that receives optical signals with a detector, a current mirror for use in providing current to the detector such that a reference voltage of the detector is substantially unaffected by noise on a power supply, the current mirror comprising:
    a regulating amplifier having as inputs a reference voltage and a node voltage of a node;
    a mirror circuit connected with an output of the regulating amplifier, the current mirror circuit connected with the detector at the node, wherein the regulating amplifier drives the current mirror circuit such that the node voltage is substantially matched to the reference voltage when a power supply experiences noise that is passed to the node, the mirror circuit further comprising a first transistor, wherein a source terminal of the first transistor is connected to the power supply, a gate terminal of the first transistor is connected to the regulating amplifier, and a drain terminal of the first transistor is connected to the detector.

14. A current mirror as defined in claim 13, the regulating amplifier further comprising a negative feedback loop that band limits the regulating amplifier.

15. A current mirror as defined in claim 14, further comprising a second mirror circuit that mirrors a first current of the first mirror circuit.

16. A current mirror as defined in claim 15, the second mirror circuit further comprising a switching network having inputs that can be set to select a resistance of the switching network, wherein a second current through the resistance of the switching network is used to monitor the first current.

17. A current mirror as defined in claim 15, wherein the resistance of the switching network is selected based on a gain of the photodiode connected with the mirror circuit.

18. A current mirror as defined in claim 13, the mirror circuit further comprising additional transistors connected with the first transistor in one of a cascode manner, a Wilson manner, and a modified Wilson manner.

19. A current mirror as defined in claim 13, the mirror circuit further comprises a diode connected transistor.

20. In a system where a photodiode draws a current in response to power levels in an optical signal, a current mirror that provides current to the photodiode such that a bias voltage of the photodiode remains substantially unaffected by noise, the current mirror comprising:
    a first mirror circuit having one or more transistors that are connected to provide a reference current to the photodiode in response to an optical signal incident on the photodiode, wherein a node connects the photodiode with the one or more transistors; and an amplifier that is connected to control a gate terminal of at least one transistor in the one or more transistors, a first input of the amplifier connected with a reference voltage and a second input of the amplifier connected at least with the node and a drain terminal of the at least one transistor, wherein changes in a bias voltage at the node in response to noise at a power supply of the one or more transistors cause the amplifier to adjust a voltage at the gate of the at least one transistor such that the bias voltage remains substantially unchanged in response to the noise.

21. A current mirror as defined in claim 20, further comprising a second mirror circuit having at least one transistor with a gate connected to the amplifier.

22. A current mirror as defined in claim 20, the second mirror circuit configured to produce a second current that mirrors the reference current, wherein the second current generates a voltage across a resistance, the voltage being used to measure the reference current.

23. A current mirror as defined in claim 22, the second mirror circuit further comprising a switching network having one or more inputs that can be set to determine the resistance used to measure the reference current.

24. A current mirror as defined in claim 23, wherein the switching network comprises a plurality of transistors connected in parallel.

25. A current mirror as defined in claim 24, where the one or more inputs are connected to gates of the plurality of transistors such that only one transistor is on at a time.

26. A current mirror as defined in claim 25, the switching network further comprising a plurality of resistors that are connected with sources of the plurality of transistors such that selected resistors in the plurality of resistors are connected in series when one of the plurality of transistors is on.

27. A method for reducing the effects of noise in a power supply on current produced by a photodiode in an optical receiver without using an external capacitance, the method comprising:

providing a first current to a photodiode of an optical transceiver through a first mirror circuit that includes a transistor, wherein the photodiode connects to the mirror circuit at a drain terminal of the transistor; and regulating a voltage of a gate of the transistor with an amplifier such that the amplifier keeps a voltage at the drain of the transistor substantially constant in the presence of noise, the amplifier having a reference voltage as a first input and a voltage at the drain terminal of the transistor as a second input, the gate being connected to the output of the amplifier.

28. A method as defined in claim 27, further comprising providing a second current through a second mirror circuit having a transistor, wherein a gate of the transistor in the second mirror circuit is connected to the amplifier such that the second current mirrors the first current.

29. A method as defined in claim 28, further comprising connecting the second mirror circuit with a switching network, the switching network having one or more inputs.

30. A method as defined in claim 29, further comprising selecting a resistance of the switching network through the one or more inputs.

31. A method as defined in claim 29, further comprising selecting a resistance of the switching network based at least on a gain of a photodiode connected with the first mirror circuit.

32. A method as defined in claim 29, further comprising measuring the second current to monitor the first current.

33. A method as defined in claim 27, further comprising connecting the amplifier with additional mirror circuits.

34. A method as defined in claim 27, further comprising connecting the amplifier with a negative feedback loop to prevent the amplifier from oscillating.

35. A method as defined in claim 27, further comprising connecting the transistor in a cascode manner with additional transistors or with a diode connected transistor.

* * * * *

UNITED STATES PATENT AND TRADEMARK OFFICE
CERTIFICATE OF CORRECTION

PATENT NO. : 7,439,480 B2
APPLICATION NO. : 11/072180
DATED : October 21, 2008
INVENTOR(S) : Timothy G. Moran

It is certified that error appears in the above-identified patent and that said Letters Patent is hereby corrected as shown below:

Drawings
Sheet 4 of 4, Fig. 4, change "412" referring to the "AND gate" to --422--

Col. 3
Line 26, change "need" to --need for--

Signed and Sealed this

Twenty-third Day of February, 2010

David J. Kappos
*Director of the United States Patent and Trademark Office*